(12) United States Patent
Wegener

(10) Patent No.: US 7,893,852 B2
(45) Date of Patent: *Feb. 22, 2011

(54) ENHANCED TIME-INTERLEAVED A/D CONVERSION USING COMPRESSION

(75) Inventor: Albert W. Wegener, Portola Valley, CA (US)

(73) Assignee: Samplify Systems, Inc., Santa Clara, CA (US)

( * ) Notice: Subject to any disclaimer, the term of this patent is extended or adjusted under 35 U.S.C. 154(b) by 1 day.

This patent is subject to a terminal disclaimer.

(21) Appl. No.: 12/429,082

(22) Filed: Apr. 23, 2009

(65) Prior Publication Data

US 2009/0201181 A1    Aug. 13, 2009

Related U.S. Application Data

(63) Continuation of application No. 11/458,771, filed on Jul. 20, 2006, now Pat. No. 7,541,950.

(51) Int. Cl.
*H03M 7/30* (2006.01)

(52) U.S. Cl. .......................................... 341/76; 375/246
(58) Field of Classification Search ............ 341/55–155
See application file for complete search history.

(56) References Cited

U.S. PATENT DOCUMENTS

| | | | |
|---|---|---|---|
| 4,968,988 A | 11/1990 | Miki et al. | |
| 4,982,193 A | 1/1991 | Saul et al. | |
| 5,127,022 A | 6/1992 | Takegahara et al. | |
| 5,973,629 A | 10/1999 | Fujii et al. | |
| 6,259,761 B1 | 7/2001 | Lai | |
| 6,470,065 B1 | 10/2002 | Lauther et al. | |
| 6,476,749 B1 | 11/2002 | Yeap et al. | |
| 7,009,533 B1 | 3/2006 | Wegener | |

(Continued)

FOREIGN PATENT DOCUMENTS

JP   H4261650   9/1992

OTHER PUBLICATIONS

El-Sankary, et al., "A New Time-Interleaved Architecture for High-Speed A/D Converters," IEEE Int'l Workshop on Digital and Computational Video, Nov. 2002, pp. 93-99.

(Continued)

*Primary Examiner*—Lam T Mai
(74) *Attorney, Agent, or Firm*—Haynes Beffel & Wolfeld LLP; Carolyn Koenig

(57) ABSTRACT

Compression of signal samples output from a parallel, time-interleaved analog to digital converter (TIADC) for a baseband signal, includes calculating first or higher order differences of consecutive signal samples followed by lossless or lossy encoding of the difference samples to produce compressed samples. Compression of a TIADC output signal with a nonzero center frequency, includes calculating sums or differences of pairs of signal samples separated by an appropriate number of sampling intervals followed by lossless or lossy encoding. The sums or differences of the signal samples have lower magnitudes than the original samples, allowing more efficient compression. Lossy compression alternatives produce compressed data with a fixed bit rate or with a fixed quality in the decompressed samples. Alternatives for lossy compression include attenuating the analog signal before sampling by the TIADC, applying bit shifters or multipliers after sampling to reduce the magnitudes of the signal samples, and lossy encoding.

22 Claims, 12 Drawing Sheets

U.S. PATENT DOCUMENTS

| | | | |
|---|---|---|---|
| 7,012,559 B1 * | 3/2006 | Pan et al. | 341/161 |
| 7,227,479 B1 * | 6/2007 | Chen et al. | 341/118 |
| 7,233,270 B2 * | 6/2007 | Lin | 341/118 |
| 7,250,885 B1 * | 7/2007 | Nairn | 341/141 |
| 2003/0076899 A1 | 4/2003 | Kumar et al. | |
| 2003/0228041 A1 | 12/2003 | Bae et al. | |

OTHER PUBLICATIONS

PCT Search Report from PCT/US07/73286 mailed Sep. 10, 2008, 12 pages.

Poulton, et al., "A 20 Gs/s 8b ADC with a 1 MB Memory in 0.18um CMOS," ISCC 2003, Session 18.

* cited by examiner

Example Differences or Sums

| Band | Center Freq. | Inverter control | Mux control | Example Differences or Sums |
|---|---|---|---|---|
| 1 | DC | ON (−) | TOP x(i)−x(i−1) | x(i): 32767 32702 32508 32186 31757 31163 30465 29648 28713 27666<br>x(i−1): ----- 32767 32702 32508 32186 31737 31163 30465 29648 28713<br>DIFF: ----- −65 −194 −322 −449 −574 −707 −781 −935 −1047 ... 512 / 522 |
| 2 | $f_s/6$ | OFF (+) | BOT x(i)+x(i−3) | x(i): 32767 16628 −15890 −32756 −17356 15140 32722 18071 −14382<br>x(i−3): ----- ----- ----- 32767 16628 −15890 −32756 −17356 15140<br>SUM: ----- ----- ----- 11 −728 −750 −34 715 758 ... 532 |
| 3 | $f_s/4$ | OFF (+) | MID x(i)+x(i−2) | x(i): 32767 −389 −32758 1166 32730 −1944 −32684 2719 32619 −3494<br>x(i−2): ----- ----- 32767 −389 −32758 1166 32730 −1944 −32684 2719<br>SUM: ----- ----- 9 777 −28 −778 46 775 −65 −775 |
| 4 | $f_s/3$ | ON (−) | BOT x(i)−x(i−3) | x(i): 32767 −15792 −17546 32703 −13977 −19233 32513 −12107 −20845 32198<br>x(i−3): ----- ----- ----- 32767 −15792 −17546 32703 −13977 −19233 32513<br>DIFF: ----- ----- ----- −64 1815 1687 −190 1870 −1612 −315 ... 542 |
| 5 | $f_s/2$ | OFF (+) | TOP x(i)+x(i−1) | x(i): 32767 −32671 32382 −31906 31239 −30392 29364 −28166 26801 −25280<br>x(i−1): ----- 32767 −32671 32382 −31906 31239 −30392 29364 −28166 26801<br>SUM: ----- 96 −289 476 −667 847 −1028 1198 −1365 1521 ... 552 |

Figure 5

ENHANCED TIME-INTERLEAVED A/D CONVERSION USING COMPRESSION

CROSS-REFERENCE TO OTHER APPLICATIONS

This application is a continuation of U.S. patent application Ser. No. 11/458,771 filed on 20 Jul. 2006.

RELATED APPLICATIONS

This application is related to an application (SMPL 1003-3) of the same title, filed on the same day as the present application, having application Ser. No. 12/429,085 (now U.S. Pat. No. 7,796,078).

FEDERALLY SPONSORED RESEARCH OR DEVELOPMENT

None.

PARTIES TO A JOINT RESEARCH AGREEMENT

None.

BACKGROUND OF THE INVENTION

The present invention relates to the compression of signal samples generated by parallel, time-interleaved analog to digital (A/D) converters and to the subsequent decompression of the compressed samples.

Parallel, time-interleaved analog to digital converters (TIADCs) are well known by those skilled the art as being useful for high speed data conversion of analog signals. TIADCs are used to sample analog signals at high sample rates, usually above 100 Msamp/sec. A TIADC can sample an analog signal at a sample rate $f_s$ that is a multiple of the sample rate $f_{sADC}$ of a single analog to digital converter (ADC). In general, a TIADC device includes two or more individual analog to digital converters operating in parallel at the same sample rate, with each ADC sampling at a different phase offset. The resulting samples from the parallel ADCs are consecutive and have a fixed time delay between samples corresponding to the phase offset. For example, for N parallel ADCs each operating at a sample rate of $f_{sADC}$ the delay between consecutive samples the TIADC is $T_s=1/(Nf_{sADC})$. The sample rate of signal samples at the output of the TIADC is $f_s=1/T_s$. Architectures for TIADCs are described by Miki et al. in U.S. Pat. No. 4,968,988 and by El-Sankary et al. in "A New Time-Interleaved Architecture for High-Speed A/D Converters", IEEE International Workshop on Digital and Computational Video, November 2002, pp. 93-99, both incorporated herein by reference. There are many different implementations of TIADCs well known to those skilled in the art.

In many high-speed applications, signal samples thus generated have a fixed data width, such as 12 bits per sample, and are stored in memory and/or transferred over a data bus, network connection or other interface. Data transfers, especially over legacy interfaces, may not be able to keep up with data output from the TIADC, thus creating bottlenecks and large memory requirements. As data converter technology improves and sample rate and bit width per sample increase, the problems of transferring sampled data streams over standard busses or networks and storing sampled data in semiconductor memory or on disks become worse. These problems are made N times more difficult when the sampled data are generated by N parallel time interleaved ADCs. Compression of samples output from TIADCs reduces bandwidth requirements (sample widths and/or clock rates) and thus reduces required storage capacity, increases the speed and/or reduces the time required to transfer sampled data over an interface.

In the context of the present invention, the term "high-speed signals" refers generally to signals whose bandwidth of 50 MHz or higher requires sample rates of 100 megasamples/sec (Msamp/sec) or higher. Such high-speed signals become more prevalent every year because the operating frequencies, or clock rates, of electronic components continue to increase according to Moore's Law, which states that the density of transistors in semiconductor devices will double every 18 months. As the transistors become smaller, their switching speeds increase proportionally; smaller transistors switch at faster rates. As higher transistor switching speeds enable faster operating frequencies for electronic components, signals with wider bandwidths can be processed, because faster transistors are used to build faster A/D and D/A converters, especially using CMOS technology.

To provide an example of increasing signal bandwidths and ADC sample rates over time, cellular telephony began in the 1980s with an analog bandwidth per channel of just 30 kHz, and all of the processing was performed using analog technology. In the 1990s, the Global System for Mobility (GSM) cellular standard deployed 200 KHz carriers, for a 7 times increase in bandwidth over the earlier analog cellular bandwidth. GSM processing was performed using a combination of analog filtering of these 200 KHz carriers, followed by ADC sampling of the filtered signal and subsequent digital processing by digital signal processor (DSP) chips. The so-called $3_G$ wireless standard that began to be deployed in 2002 uses 5 MHz carriers, and the emerging (as of 2006) WiMax standard uses up to 40 MHz carrier bandwidth. These 3G and WiMax systems utilize A/D and D/A converters operating at tens and hundreds of Msamp/sec to digitize multiple carriers at once, performing all filtering and subsequent processing in the digital domain. These trends towards wider signal bandwidths are also prevalent in medical imaging (including computed tomography [CT] scanners, ultrasound, and magnetic resonance imaging [MRI]) and test and measurement equipment (including oscilloscopes and waveform generators), among other application areas.

Test and measurement equipment is an important application because every electronic device must be tested, both during the development stage and in the production stage. Such testing is commonly performed by oscilloscopes, which display a visual representation of an electronic waveform whose characteristics are then measured. As the switching speeds of transistors increases, oscilloscopes keep up by increasing the sample rate of their front end A/D converters. Given the architectural and process limitations of the fastest available A/D converter architecture, flash A/D converters, the maximum rate of a single flash A/D converter is today (2006) on the order of 1 Gsamp/sec, using 8-bit samples. If a signal with a bandwidth above 500 MHz (the Nyquist frequency when the sample rate is 1 Gsamp/sec) is to be digitized, multiple, time-interleaved A/D converters operating in parallel will have to be employed. As is well known to those skilled in the art of oscilloscopes, a high oversampling ratio of at least 5×, and preferably 10×, of the input signal bandwidth, is desirable in order to make accurate measurements of common signal parameters such as rise time, fall time, jitter, and signal period. Thus for the fastest electronic signals, such as 6.25 Gbps serializer/deserializer (SerDes) waveforms, an oscilloscope's sample rate should be at least 6.25×5x=31.25 Gsamp/sec, and preferably 6.25×10x=62.5 Gsamp/sec. Since the maximum sample rate of the fastest single A/D converters (flash A/D converters) is limited to about 1 Gsamp/sec, the oscilloscope sample rates required to measure such wideband signals can only be achieved using TIADCs. The present invention improves the operation of such TIADCs by providing compression as described below.

When purchasing an oscilloscope, there are two primary figures of merit that matter: scope bandwidth and scope memory depth. As discussed above, faster signaling rates require wider scope bandwidth and a correspondingly faster oscilloscope A/D converter front end. The second parameter, memory depth, also increases every year for a related reason. If a fixed time duration, such as 1 microsecond (usec), of a signal is to be captured in an oscilloscope, the amount of memory used to capture the A/D converter samples corresponding to that time duration is proportional to the sample rate. If the sample rate doubles, the amount of memory needed to capture the signal also doubles, though the signal duration remains constant. For instance, at 20 Gsamp/sec, a 1 usec signal capture generates 20,000 samples. At 40 Gsamp/sec, a 1 usec signal capture generates 40,000 samples. So simply by requiring faster A/D converter front ends year after year, an oscilloscope's sample memory must also be increased each year. Furthermore, the oscilloscope sample capture memory must be designed to accept the higher-rate samples, and that is not always easily achieved. For example, the fastest available memory technology (SRAM) is often used to capture oscilloscope samples, but SRAM cells are typically limited to 500 MHz clock rates for sequential accesses. In order to capture A/D converter samples at 40 Gsamp/sec, an interleaving or demultiplexing strategy reduces the raw A/D converter rate to a rate that can be used with conventional SRAM cells. Thus a 40 Gsamp/sec front end must be demultiplexed into at least 80 streams, each of which accesses an SRAM block at 500 Msamp/sec. As oscilloscope sample rates increase year after year, these demultiplexing and interleaving strategies increase the complexity and cost of oscilloscope storage subsystems.

An oscilloscope's memory subsystem is often the most expensive portion of the application specific integrated circuit (ASIC) that implements its TIADC and capture memory.

In order to achieve the highest sample rates in combination with deep memory for capturing those high-speed samples, oscilloscope manufacturers such as Agilent and Tektronix have designed their own ASICs that combine TIADCs with capture memory subsystems on a single IC. It is important to note that these custom oscilloscope ASICs dedicate most of the chip area (gate count) to the memory subsystem, not to TIADC subsystem. Thus from a cost perspective, the high-speed capture memory is the significantly more expensive element of the front-end oscilloscope ASIC. Because the present invention's compression technology enables the storage of significantly more samples, in compressed form, in an oscilloscope's high-speed capture memory, the present invention significantly lowers the cost per bit of one of the most expensive (and most visible, from a marketing perspective) components of a high-speed digital storage oscilloscope (DSO). To summarize, the present invention enables a significant increase in the signal duration that can be captured and stored in data acquisition systems, such as those found in DSOs, by compressing the samples after acquisition by a TIADC front end and prior to storing or transmitting the compressed samples in a capture memory (such as in high-speed SRAM in a DSO).

In U.S. Pat. No. 5,973,629, Fujii describes compression of signal samples output from a single ADC. Fujii teaches differential encoding of samples by applying a delay to each sample to form a previous sample and subtracting the previous sample from a current sample to form a difference sample. Variable quantization is then applied to the difference samples to form an output bit stream. Fujii's system uses a single ADC so that a delay element is required to form differences between consecutive signal samples. In U.S. Pat. No. 5,127,022, Takegahara describes differential encoding of signal samples output from a single ADC. Takegahara teaches applying one or more delays to output samples so that the differences formed are between samples separated by one or more sampling intervals. A selector selects the delay(s) that produces the lower magnitude difference signal. Takegahara's system uses a single ADC so that one or more delay elements are required for differential encoding.

In U.S. Pat. No. 6,476,749 B1, Yeap et al. describe a TIADC system wherein the analog signal is channelized and each channel is input to a different ADC. Subsequent to sampling, the signal samples output from each ADC are summed to produce a full bandwidth sampled signal. Yeap et al. do not teach compression of the samples output from the TIADCs.

In U.S. Pat. No. 4,982,193, Saul et al. describe a TIADC system wherein an analog signal is sampled at multiples of a carrier frequency of the analog signal. Samples that correspond with the same carrier phase, output from the same ADC, are averaged in order to improve the signal-to-noise ratio. Saul et al. do not teach compression of the samples output from the TIADCs.

In U.S. Patent Application Publication no. US2003/0076899 A1, Kumar et al. describe a TIADC system wherein the parallel ADCs are followed by a polyphase filter bank and an FFT processor. Kumar's system samples as well as channelizes an input analog signal. Kumar et al. do not teach compression of the signal samples output from the TIADCs.

In summary, above cited patents '629 and '022 disclose forms of differential encoding applied to samples output from a single ADC. Because there is a single ADC, the differential encoding disclosed requires at least one delay element to delay each output sample from the ADC in order form a difference with each current sample. The above cited patents '749 and '193 and patent application '899 disclose various operations on the signal samples output from TIADCs for various purposes. They do not disclose differential encoding or other compression of the signal samples output from the TIADC.

SUMMARY OF THE INVENTION

Data compression of samples output from TIADCs increases the efficiency of data conversion, storage and transfer. Compressing the samples reduces the data width which reduces the size of memory required to store the compressed samples, or alternatively, reduces the clock rate of the memory interface. Compressing the samples also allows faster transfer over data busses or other interfaces. Applications such as digital storage oscilloscopes (DSOs) that depend upon the operation of TIADCs to acquire electronic or optical signals at high sample rates are also improved by the present invention. The present invention enables the storage of significantly more samples in a fixed capture buffer. As a result, DSOs can generate better measurements that exhibit higher accuracy, lower error bounds and higher confidence intervals.

The present invention is directed to the real time compression of samples output from a TIADC. "Real time" refers to the ability of the present invention's compression process to continuously reduce the bit rate at a speed that is at least as fast as the rate at which the TIADC generates uncompressed samples. The present invention takes advantage of the temporal relationship between samples output from the TIADC to efficiently perform operations for compression without requiring delay elements. The present invention also exploits the frequency characteristics of the signal to determine the operations that will provide compressed samples with the fewest number of bits.

An object of the invention is to provide a method and a system for compressing samples of a baseband signal. For a baseband signal, differences are formed between consecutive samples output from the TIADC. The difference samples have smaller data widths than the original samples. The difference samples are then encoded using lossless techniques (Huffman encoding, run-length encoding or other lossless encoding) or lossy techniques, such as adaptive differential pulse code modulation (ADPCM) or linear predictive coding (LPC) well known to those skilled in the art.

Another object of the invention is to provide a method and a system for compressing samples of a signal with an arbitrary center frequency. Depending on the frequency band of the analog signal input to the TIADC, selected pairs of signal samples output from the TIADC are added or subtracted to form modified samples with smaller data widths than the original samples. The modified samples are then encoded using Huffman encoding, variable quantization methods, or other encoding well known to those skilled in the art.

Another object of the invention is to incorporate both lossless and lossy compression. In lossless compression, the sampled data stream recovered after decompressing the compressed samples is identical to the original sampled data stream. In lossy compression, the sampled data stream recovered after decompressing the compressed samples approximates the original sampled data stream. While the signal quality of the decompressed stream created during the lossy compression is reduced, the compressed stream will require fewer bits, i.e. will offer a higher compression ratio than for lossless compression. The present invention allows users to control the lossy compression result by either a) user-specified quality of the decompressed data, or b) a user-specified compression ratio. The features of lossless and lossy compression and user control provide advantages to a wide variety of systems.

BRIEF DESCRIPTION OF THE DRAWINGS

FIG. 1b shows a timing diagram for the conventional TIADC of FIG. 1a.

FIG. 5 presents examples of compressed samples from the system of FIG. 3.

DETAILED DESCRIPTION

Figure 1A:
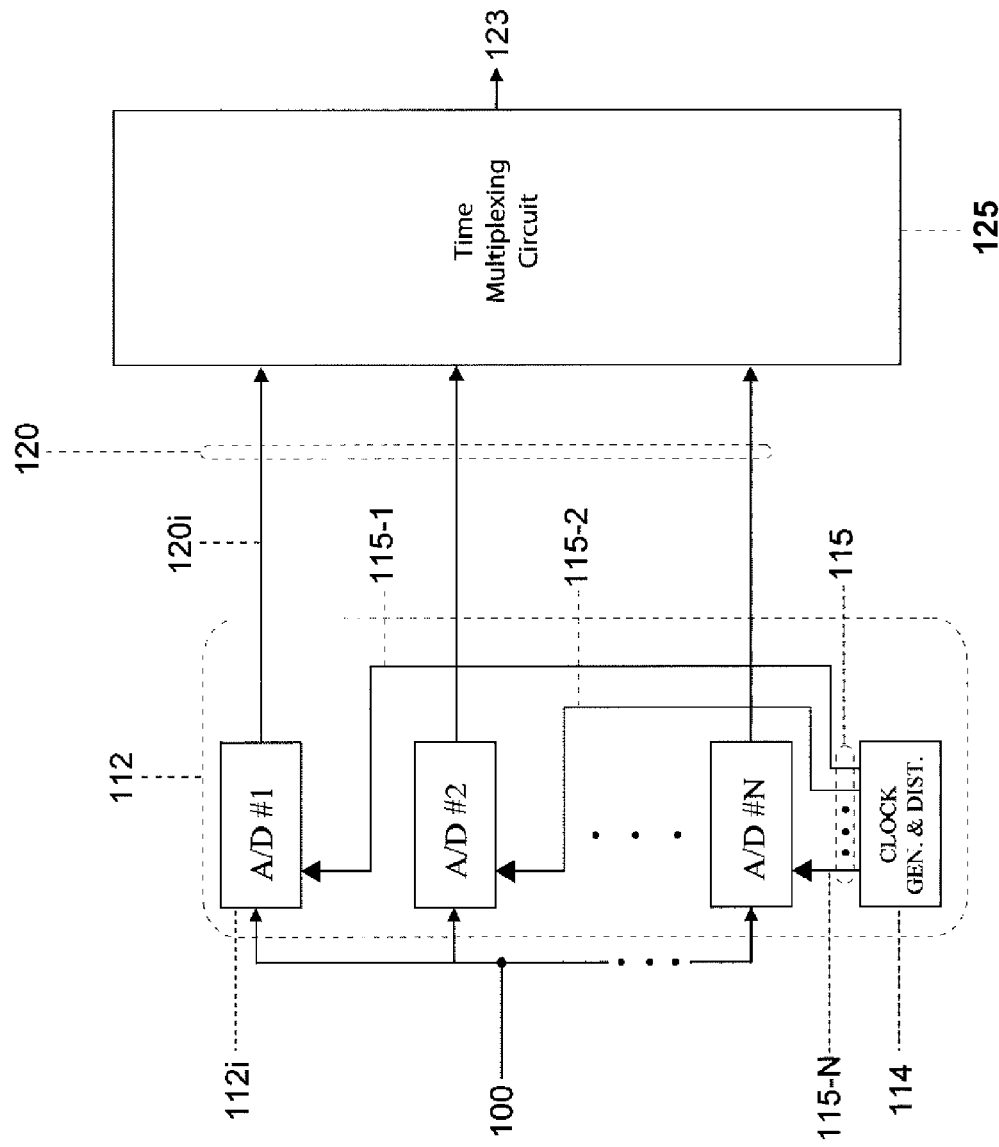
FIG. 1a is a block diagram showing an overall arrangement of a conventional time-interleaved analog to digital converter (TIADC).

The present invention compresses signal samples output from a TIADC. A block diagram of a conventional TIADC familiar to those skilled in the art is given in FIG. 1a. The TIADC of FIG. 1a is designed to achieve a sample rate $f_s$, that is N times as great as the sample rate $f_{sADC}$ of an individual ADC by using N parallel ADCs, where N is at least 2. Clock generator and distributor 114 provides timing control signals 115 for activating each of the ADCs 112i at predetermined time intervals. For example, timing control signals 115-1, 115-2 and 115-N are coupled to A/D#1, A/D#2 and A/D#N, respectively. Upon activation by timing control signals 115, each ADC 112i samples an analog signal 100 to produce a signal sample 120i. During a clock interval T, the TIADC produces a plurality of signal samples 120 that are consecutive and separated in time by a predetermined sampling interval $T_s$. In a conventional TIADC, a time multiplexing circuit 125 selectively receives the plurality of signal samples 120 and provides N signal samples to its output terminal 123 in a time duration of T.

Figure 1B:
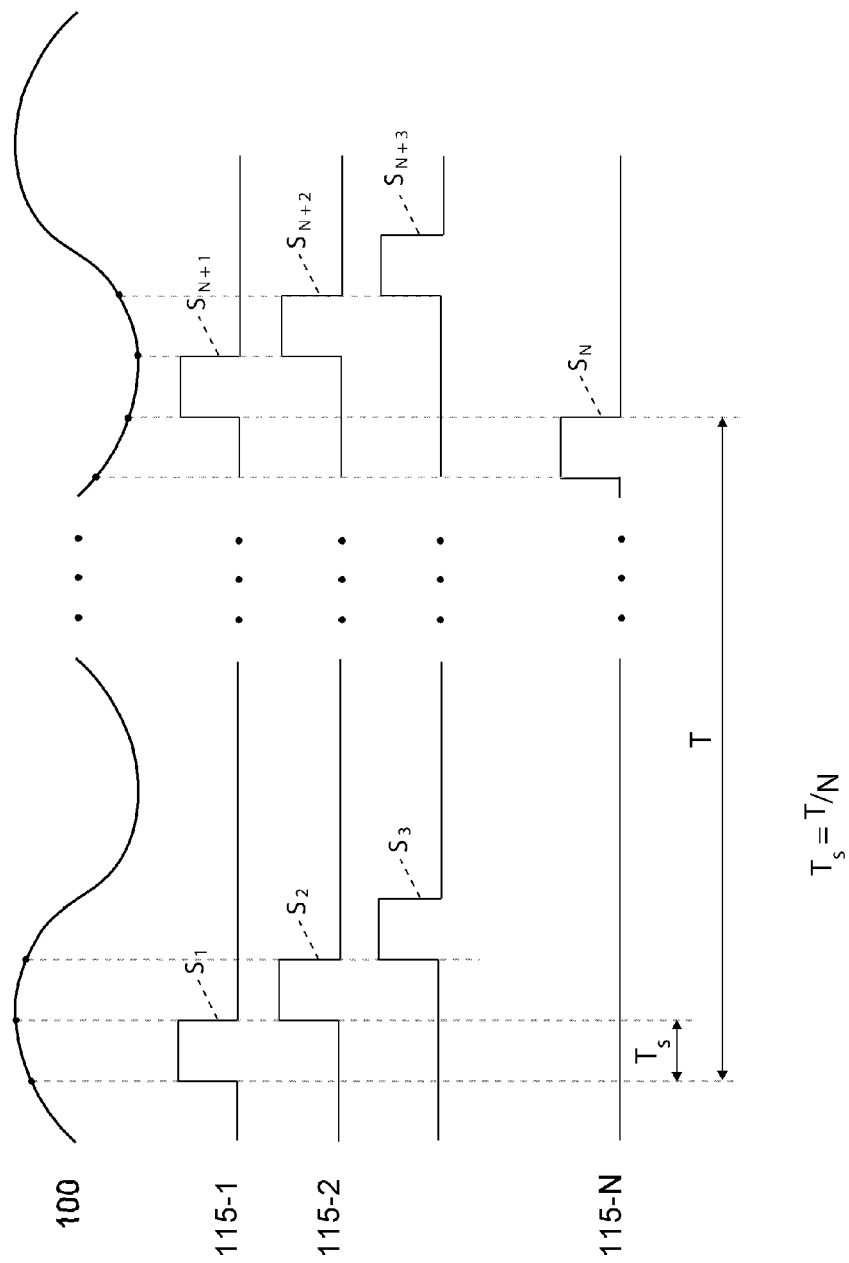

The operation of the TIADC of FIG. 1a is further described with reference to FIG. 1b which shows a timing diagram and relates it to the sampling of an analog signal 100. In FIG. 1b, the waveforms illustrated for timing control signals 115-1 to 115-N have pulses $S_1$ to $S_N$, respectively. The pulses $S_1$ to $S_N$ are offset in phase so that the corresponding ADCs 112i are sequentially activated at a time interval of $T_s$, and sample analog signal 100 at sampling times separated by $T_s$, the sampling interval. The sampling interval $T_s$, is 1/N the duration of the clock interval T. With the TIADC design of FIG. 1a, although each individual ADC 112i has a relatively a long sampling period T, which is the clock interval, the N signal samples 120 provided to the time multiplexing circuit 125 have a substantially reduced sampling period $T_s$. This is effective to provide signal samples at a high speed sample rate $f_s$, that is N times the sample rate $f_{sADC}$ of an individual ADC 112i. Note that the sample rate $f_{sADC}$ is equal to the clock rate of clock generator and distributor 114 and $f_{sADC}=1/T$.

The preferred embodiments include systems that operate on signals whose center frequency $f_c=0$ Hz, hereafter called a baseband signal, or whose center frequency $f_c$ is greater than 0 Hz but below the Nyquist frequency. The Nyquist frequency is defined to be half of the sampling frequency. Operations applied to signal samples output from the TIADC produce modified samples having smaller magnitudes than the original signal samples.

Figure 1C:
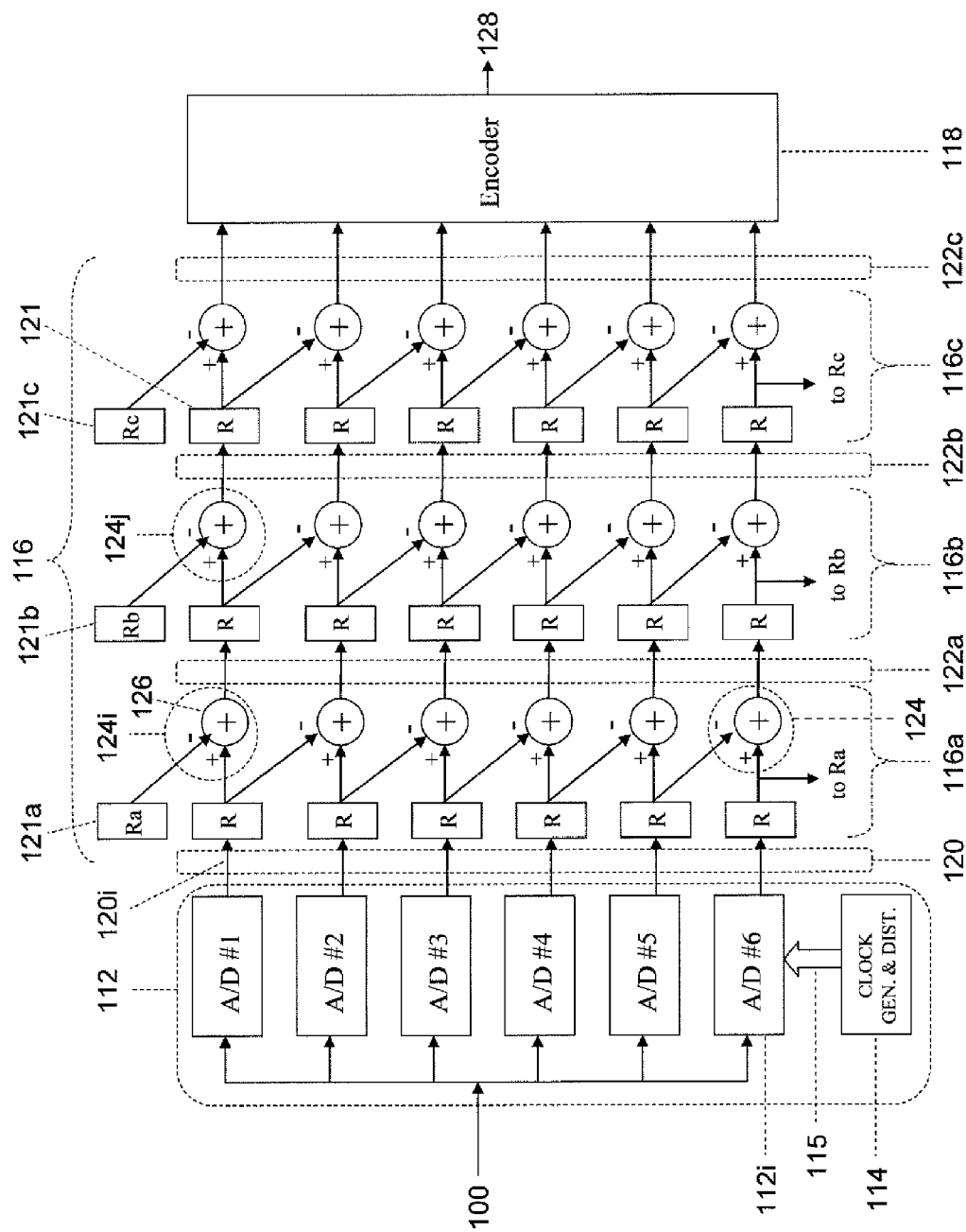
FIG. 1c is a block diagram of a data conversion and compression system for a baseband signal in accordance with a preferred embodiment.

FIG. 1c is a block diagram of a system for data conversion and compression of a baseband signal. For a baseband signal, computing differences between consecutive signal samples creates difference samples whose magnitudes are smaller than those of the original signal samples. In FIG. 1c, an analog signal 100 is input to TIADC 112. The TIADC 112 comprises a plurality of ADCs, each ADC 112i receiving input analog signal 100 and timing control signal 115 from the clock generator and distributor 114 for controlling the sampling by the ADCs 112i at different phase offsets. In this example, there are six ADCs 112i, however TIADC 112 can include as few as two individual ADCs 112i. One of ordinary skill in the art will recognize that this is a simplified representation of a TIADC device and that there are many different strategies for signal distribution and control. When sampling analog signal 100, TIADC 112 produces a plurality of signal samples 120 which represent consecutive samples of analog signal 100. The plurality of signal samples 120 are input to a difference processor 116. Difference processor 116 includes one or more difference processor stages 116a, 116b and 116c. A first difference processor stage 116a calculates a plurality of first order differences 122a. The plurality of first order differences 122a are input to a second difference processor stage 116b for calculating a plurality of second order differences 122b. The plurality of second order differences 122b are input to a third difference processor stage 116c for calculating a plurality of third order differences 122c. The plurality of third order differences 122c are then processed by encoder 118. For any difference processor stage 116a, 116b or 116c, the resulting plurality of differences 122a, 122b or 122c, respectively, can then be processed by encoder 118. In alternative embodiments, fewer difference processor stages can be implemented. For example, for encoding first differences only, the plurality of first order differences 122a from the first difference processor stage 116a would be input to the encoder 118. In another alternative embodiment, described below with reference to FIG. 1d, a controller can select first order differences or higher order differences for minimizing the output bit rate of encoder 118.

Returning to FIG. 1c, each difference processor stage 116a, 116b and 116c comprises at least one difference operator 124. Each difference operator 124 receives two inputs that represent consecutive samples of analog signal 100. For the first difference processor stage 116a, the two inputs to difference operator 124i are two consecutive samples from the plurality of signal samples 120. For the second difference processor stage 116b, the two inputs to difference operator 124j are two consecutive difference samples from the plurality of first order differences 122a. Each difference operator 124 includes a subtractor 126 for forming a difference between the input samples. Registers 121, 121a, 121b, and 121c distribute the appropriate inputs to the difference operators 124.

In the embodiment of FIG. 1c, encoder 118 compresses the plurality of third order differences 122c to produce compressed samples 128. In an alternative embodiment, when the difference processor 116 includes only the first difference processor stage 116a, the encoder 118 compresses the first order differences 122a. In another alternative embodiment when the difference processor 116 includes first difference processor stage 116a and second difference processor stage 116b, the encoder 118 compresses the second order differences 122b. Encoder 118 applies Huffman encoding, block floating point encoding, run length encoding, or other lossless bit packing strategies well known to those skilled in the art. For example, Huffman encoding assigns a code to each difference value depending on the frequency of that difference value. In a block floating point representation, a group of difference samples are represented with one exponent for all samples in the group and a mantissa for each difference sample in the group. The exponents corresponding to different groups can be Huffman encoded or delta encoded. Encoder 118 can add a prefix code to groups of compressed difference samples with information such as the word length assigned to the following group of compressed difference samples. Run-length encoding is a technique that replaces runs, typically containing more than three consecutive samples of the same value, with a run-length indicator, a token representing the value to be repeated and a token representing the number of values in the run. In alternative embodiments, encoder 118 can be configured to compress subgroups of difference samples independently or to compress each input channel independently. In an embodiment described below with respect to FIG. 7, encoder 118 includes lossy encoding techniques.

Figure 1D:
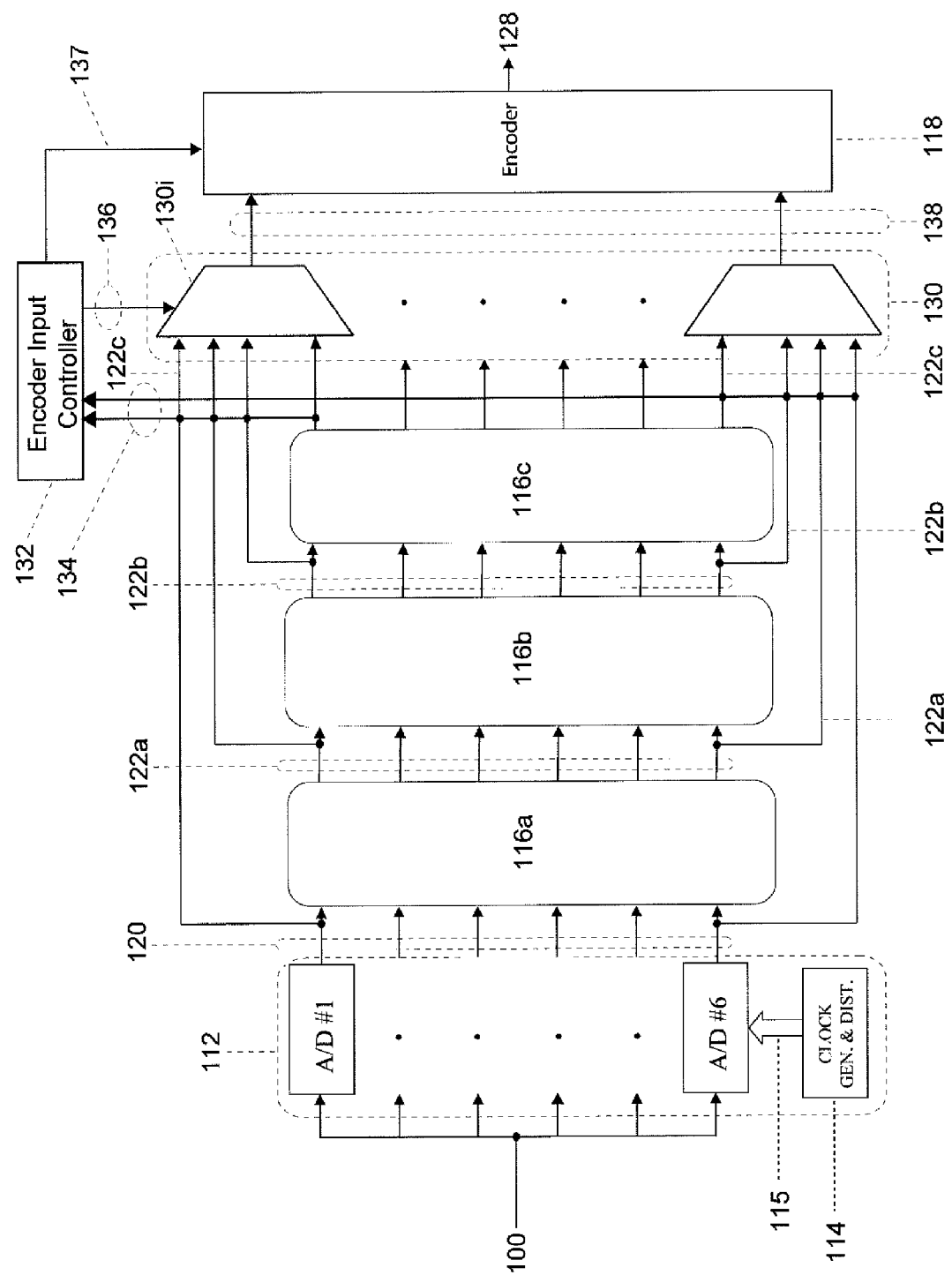
FIG. 1d is a block diagram of a data conversion and compression system that includes a encoder input controller in accordance with a preferred embodiment.

FIG. 1d is a block diagram of a data conversion and compression system for a baseband signal that includes an encoder input controller 132. Encoder input controller 132 analyzes the data stream of signal samples 120 output from the TIADC 112 and the data streams of difference samples 122a, 122b and 122c output from the difference processor stages 116a, 116b and 116c, respectively, to select the data stream that requires the fewest bits to encode. In FIG. 1d, encoder input controller 132 receives controller input 134 comprising the plurality of signal samples 120 and the plurality of difference samples 122a, 122b and 122c. Encoder input controller 132 calculates the number of bits required for each data stream included in the controller input 134. In a preferred embodiment, encoder input controller 132 also calculates the number of bits required for a number of encoding options, including the aforementioned Huffman encoder, run-length encoder and block floating point encoder. Encoder input controller 132 then determines the data stream corresponding to the most efficient encoding and requiring the fewest number of bits. Encoder input controller 132 generates a control signal 136 that indicates the data stream selected for encoding. A plurality of selectors 130 receives the control signal 136. Each selector 130i selects samples corresponding to the indicated data stream from the plurality of signal samples 120 or the plurality of difference samples 122a, 122b or 122c to form the selected samples 138. Encoder input controller 132 also indicates an encoding option for encoder 118 using encoder control signal 137. Encoder 118 applies the selected encoding option to compress the selected samples 138, producing the compressed samples 128. For a number D of difference processor stages and a number E of different encoding options of encoder 118, encoder input controller 132 may consider up to D*E possible combinations, selecting the difference stage and encoding option that will produce compressed samples 128 with the fewest number of bits.

In a preferred embodiment, encoder input controller 132 monitors the difference samples 122a, 122b and 122c output from each difference processor stage, 116a, 116b and 116c, respectively, when processing a window of M signal samples 120. Encoder input controller 132 selects a difference processor stage, 116a, 116b or 116c that produces difference samples with the smallest sample range, or difference between the maximum difference sample and the minimum difference sample. Encoder input controller 132 can change the window size M over time. Encoder input controller 132 can cease monitoring the difference samples 122a, 122b and 122c when their statistics become regular over time and the same difference processor stage is consistently selected. The encoder input controller 132 can calculate other statistical measurements of signal samples 120 and/or difference samples 122a, 122b and 122c for selecting the difference processor stage that will minimize the number of bits required for compressed samples 128.

Encoder input controller 132 selects the encoding option for encoder 118 via encoder control signal 137. In a preferred embodiment, encoder input controller 132 periodically compares the number of bits required to encode a window of M selected samples 138 for each of the E encoding options and selects the encoding option that produces the fewest number of bits in the compressed samples 128. Encoder input controller 132 can change the window size M over time. When encoder input controller 132 determines that a particular encoding option consistently minimizes the number of required bits, it can cease the comparisons and indicate the optimum encoding option that encoder 118 will apply to the remaining selected samples 138.

Figure 2:
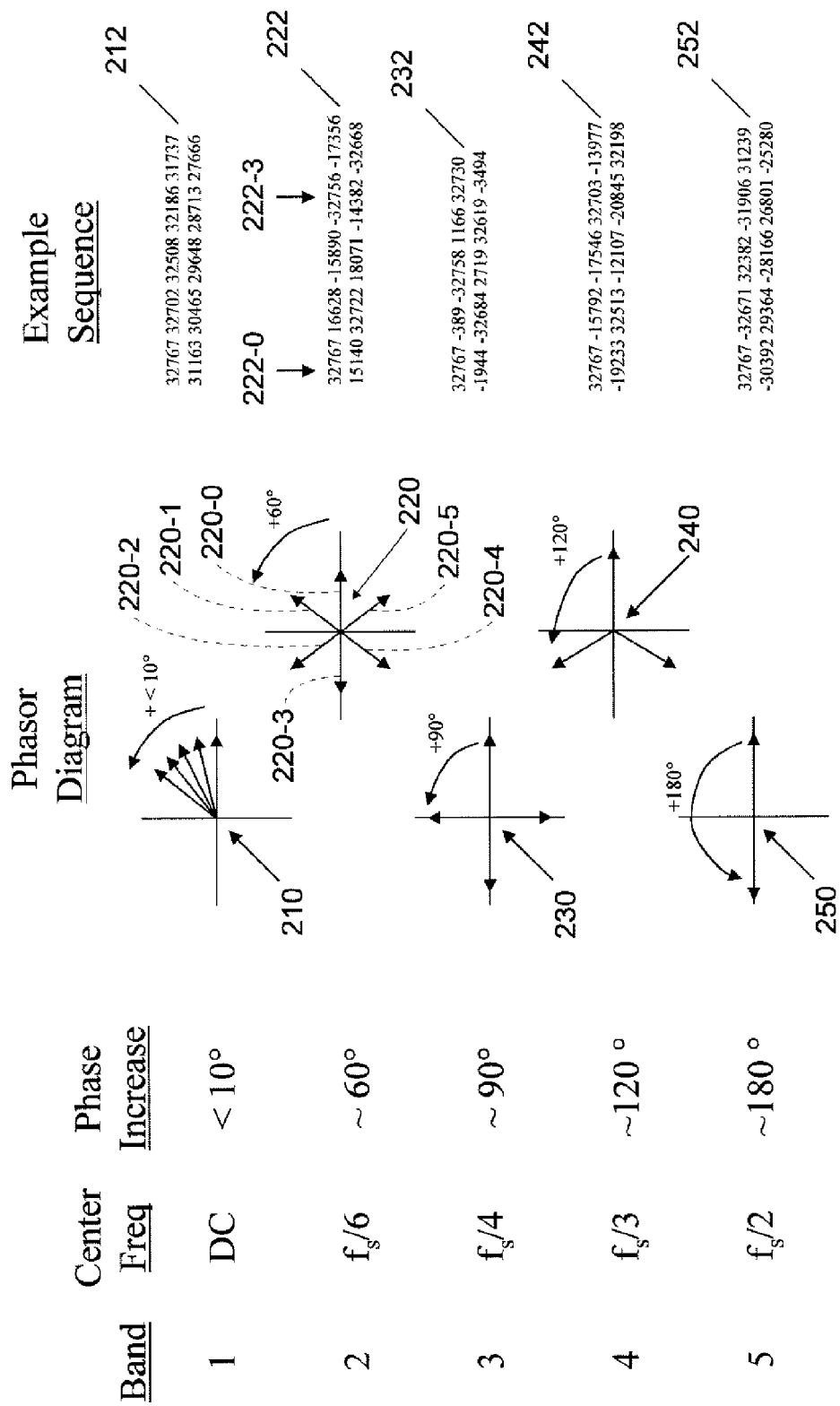
FIG. 2 gives examples that illustrate principles underlying the present invention's ability to compress signals with different center frequencies.

FIG. 2 gives examples that illustrate principles underlying the present invention's ability to compress signals with different center frequencies. Beginning with the example of a baseband signal, corresponding to row labeled "Band 1" in FIG. 2, the center frequency is near DC (0 Hz) and the phase increase between consecutive samples is less than 10 degrees. The first phasor diagram 210 shows that since the phase changes between consecutive samples are small, the magnitudes of the differences of consecutive samples will be relatively small compared to the magnitudes of the samples themselves. The first example sequence 212 corresponds to samples of a Band 1 baseband signal. Since the differences between consecutive samples are small relative to the sample magnitudes, differential encoding creates difference samples with smaller data widths than the original samples. Compression using the differential encoding approach described above with reference to FIG. 1c is effective for the baseband (Band 1) example in FIG. 2.

FIG. 2 also gives examples of sampled signals where the center frequency is above DC but below the Nyquist frequency, $f_s/2$. For Band 2, the center frequency is near $f_s/6$ and the phase increase between consecutive samples is about 60 degrees. The second phasor diagram 220 shows that pairs of samples separated by 180 degrees, or three sampling intervals, have similar magnitudes but opposite polarities, as illustrated by pairs of samples (220-0, 220-3), (220-1, 220-4) and (220-2, 220-5). Inverting one of the samples in the pair (or multiplying by −1) provides a close estimate of the other sample in the pair. The second example sequence 222 also shows that samples separated by three sampling intervals have similar magnitudes and opposite signs. For example, the value of sample 222-0 is 32767 and the value of sample 222-3 is −32756. For Band 2, operations on pairs of samples separated by three sampling intervals produce modified samples with smaller data widths. The operation of adding the samples in the pair together produces modified samples having smaller data widths that can be encoded more efficiently.

For the example of Band 3 in FIG. 2, the center frequency is near $f_s/4$ and the phase increase between consecutive samples is about 90 degrees. The third phasor diagram 230 shows that samples separated by 180 degrees, or 2 sampling intervals, have similar magnitude and opposite polarity. The third example sequence 232 also shows that every other sample has similar magnitudes and opposite polarities. For Band 3, adding together every other sample will result in modified samples with smaller data widths that can be encoded more efficiently than the original samples.

For the example of Band 4 in FIG. 2, the center frequency is near $f_s/3$ and the phase increase between consecutive samples is about 120 degrees. The fourth phasor diagram 240 shows that samples separated by 360 degrees, or 3 sampling intervals, will have similar magnitudes. The fourth example sequence 242 shows that every third sample has similar magnitudes. In this case, forming a difference between samples separated by 3 sampling intervals will give a modified sample with a smaller data width that can be encoded more efficiently than the original samples.

For the example of Band 5 in FIG. 2, the center frequency is $f_s/2$ and the phase increase between consecutive samples is about 180 degrees. The fifth phasor diagram 250 shows that samples separated by 180 degrees, or one sampling interval, will have similar magnitudes but opposite polarities. The fifth example sequence 252 shows consecutive samples have similar magnitudes and opposite polarities. In this case, adding two consecutive samples will form a modified sample with a smaller data width that can be encoded more efficiently than the original samples.

The above examples described for FIG. 2 show that data compression can be achieved by performing operations such as addition or subtraction (or inversion followed by addition) on signal samples that are separated by 1, 2 or 3 sampling intervals, depending on the ratio of the sample rate to the center frequency. The resulting modified samples are then encoded to form compressed samples. Similar operations can be applied to samples that are separated by four or more sampling intervals, depending on the ratio of the center frequency to the sample rate, to produce modified samples with smaller data widths than the original signal samples.

Figure 3:
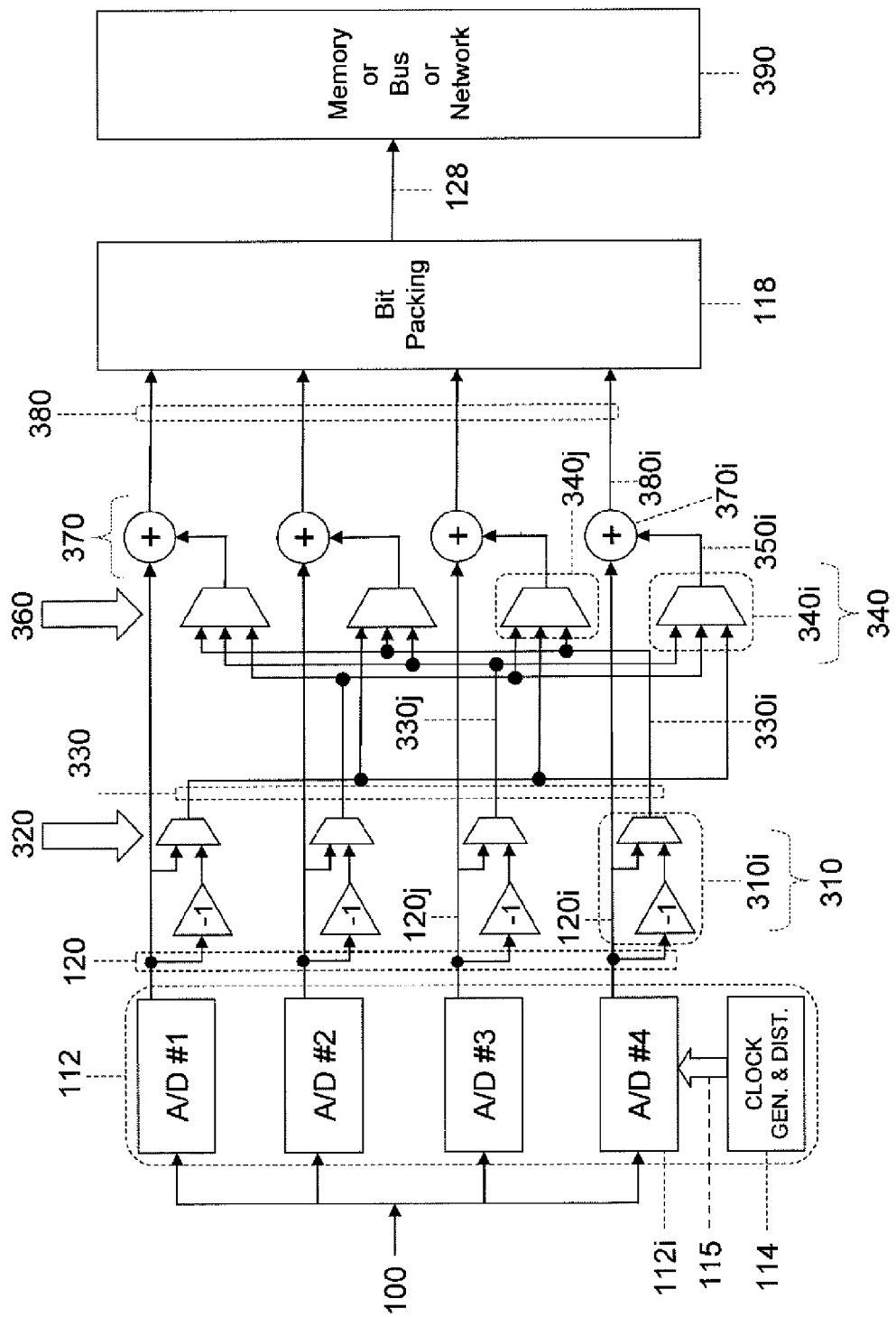
FIG. 3 is a block diagram of a data conversion and compression system for a signal with an arbitrary center frequency wherein the TIADC includes four ADCs in accordance with a preferred embodiment.

FIG. 3 is a block diagram of a data conversion and compression system for a signal with an arbitrary center frequency in accordance with a preferred embodiment. An analog signal 100 is input to a TIADC 112 as described with reference to FIG. 1c. In this example, the TIADC 112 includes four parallel ADCs 112i. The TIADC 112 samples the analog signal 100 to form a plurality of consecutive signal samples 120. Each signal sample 120i is input to a corresponding programmable inverter 310i of a plurality of programmable inverters 310. Each programmable inverter 310i selectively inverts signal sample 120i according to an inverter control parameter 320. A plurality of multiplexors 340 receives inputs selected from the plurality of inverter output samples 330. Each inverter output sample 330i is distributed to at least 1 multiplexor 340j (j not equal to i) corresponding to a signal sample 120j that is separated by at least one sampling interval from signal sample 120i. Each multiplexor 340j receives up to three inverter output samples 330i, (i not equal to j) corresponding to separations of up to three sampling intervals from signal sample 120j. Each multiplexor 340i selects a multiplexor output sample 350i from among the inverter output samples 330j, where j does not equal i, input to the multliplexor 340i. The multiplexor output sample 350i is selected according to a multiplexor control parameter 360. The plurality of multiplexor output samples and signal samples 120 are input to a plurality of adders 370. Each adder 370i adds multiplexor output sample 350i with its corresponding signal sample 120i to form a corresponding modified sample 380i. Encoder 118 compresses the plurality of modified samples 380 to produce compressed samples 128. Encoder 118 applies bit packing strategies well known to those skilled in the art as described above with reference to FIG. 1c. Compressed samples 128 can then be efficiently stored in memory or transferred over a data bus or network, as indicated by data transfer block 390.

Figure 4:
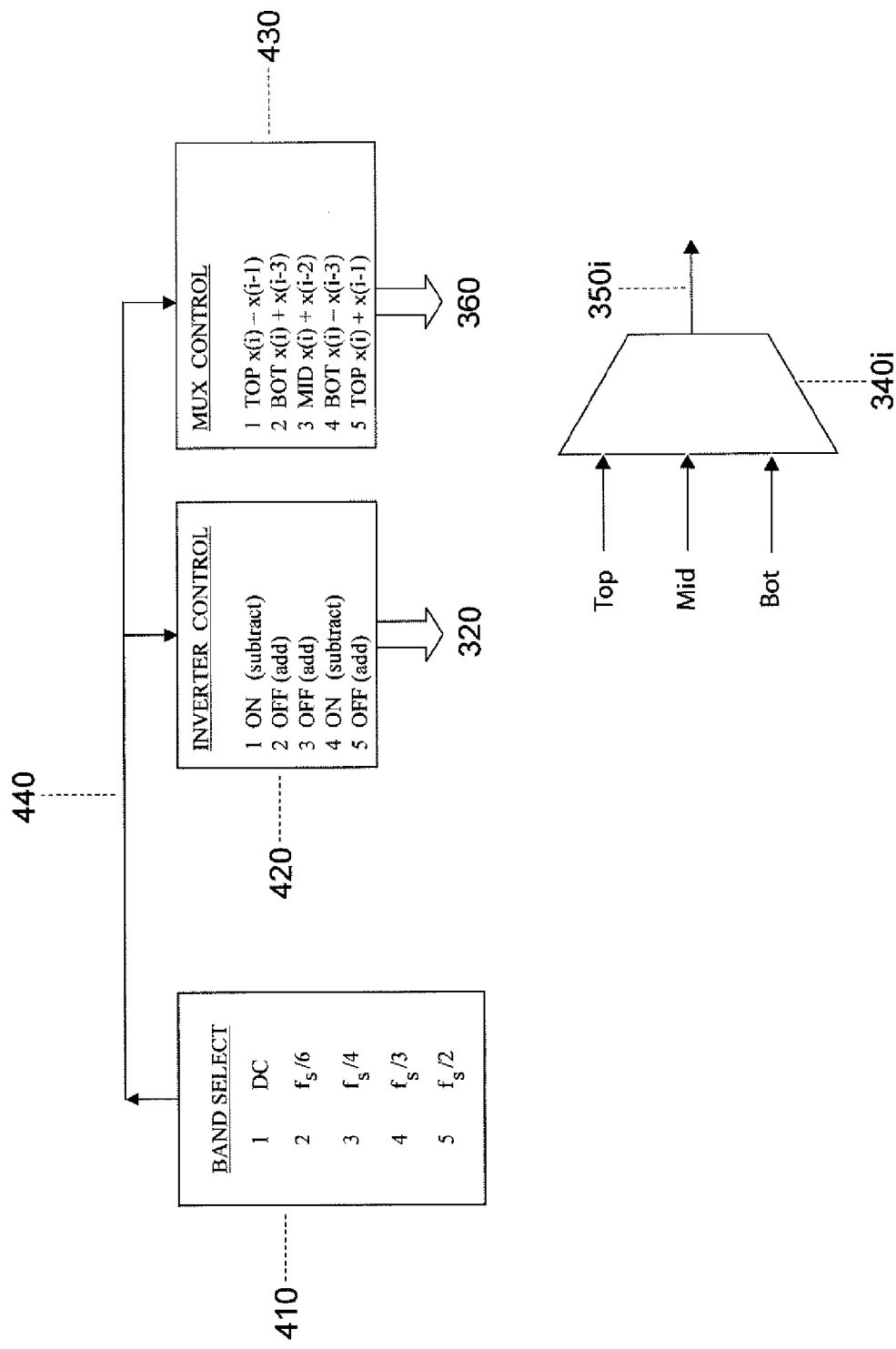
FIG. 4 is a block diagram of inverter control and multiplexor control in accordance with a preferred embodiment.

FIG. 4 illustrates inverter control 420 and multiplexor control 430 for providing, respectively, the inverter control parameter 320 and the multiplexor control parameter 360 in FIG. 3. In a preferred embodiment, inverter control 420 and multiplexor control 430 depend on the center frequency of the analog signal 100. Band selector 410 selects a band parameter 440 based on the center frequency. Inverter control 420 determines which operation will be carried out by each programmable inverter 310i based on the band parameter 440 and sets the inverter control parameter 320 accordingly. Multiplexor control 430 sets multiplexor control parameter 360 based on the band parameter 440. The multiplexor control parameter 360 indicates which inverter output sample 330j from among those input to multiplexor 340i will be the multiplexor output sample 350i. Referring back to the examples of FIG. 2, the dependence of inverter control 420 and multiplexor control 430 on center frequency is clear. Inverter control 420 enables inversion when subtraction is needed and disables inversion when addition is needed. Likewise, multiplexor control 430 selects the number of sampling intervals, corresponding to either x(i−1), x(i−2) or x(i−3), that separate inverter output sample 330j from the appropriate signal sample 120i, or x(i). In the multiplexor control 430, TOP refers to the uppermost input to multiplexor 340i corresponding to one sampling interval of separation, MID refers to the middle input corresponding to two sampling intervals of separation, and BOT refers to the lowest input corresponding to three sampling intervals of separation.

Alternative embodiments may perform mathematically equivalent operations on the signal samples 120. For example, a programmable adder/subtractor may replace adder 370i and eliminate programmable inverter 310i, since inversion followed by addition is mathematically equivalent to subtraction. Control for the programmable adder/subtractor would correspond to inverter control 420. The inputs to multiplexors 340 would be signal samples 120, instead of inverter outputs 330, and would be distributed to the multiplexors 340 in the same manner as the inverter outputs 330. In another embodiment that is mathematically equivalent to the embodiment of FIG. 3, the plurality of programmable inverters 310 are positioned between the plurality of multiplexors and the plurality of adders 370. Again, the inputs to multiplexors 340 are signal samples 120, instead of inverter outputs 330, and are distributed to the multiplexors 340 in the same manner as the inverter outputs 330. The inverter outputs 330 are then input to the plurality of adders 370.

FIG. 5 gives examples of the sums or differences of signal samples 120 calculated in accordance with the preferred embodiment of FIGS. 3 and 4 for different center frequencies, Band 1 near 0 Hz through Band 5 near $f_s/2$. These are the same signal samples 120 used in the example sequences of FIG. 2. The samples in the DIFF rows in examples 512 and 542 and the SUM rows in examples 522, 532 and 552 have substantially lower magnitudes than the corresponding signal samples 120, or x(i). The DIFF samples and the SUM samples are examples of modified samples 380 that are input to encoder 118 in FIG. 3.

Figure 6:
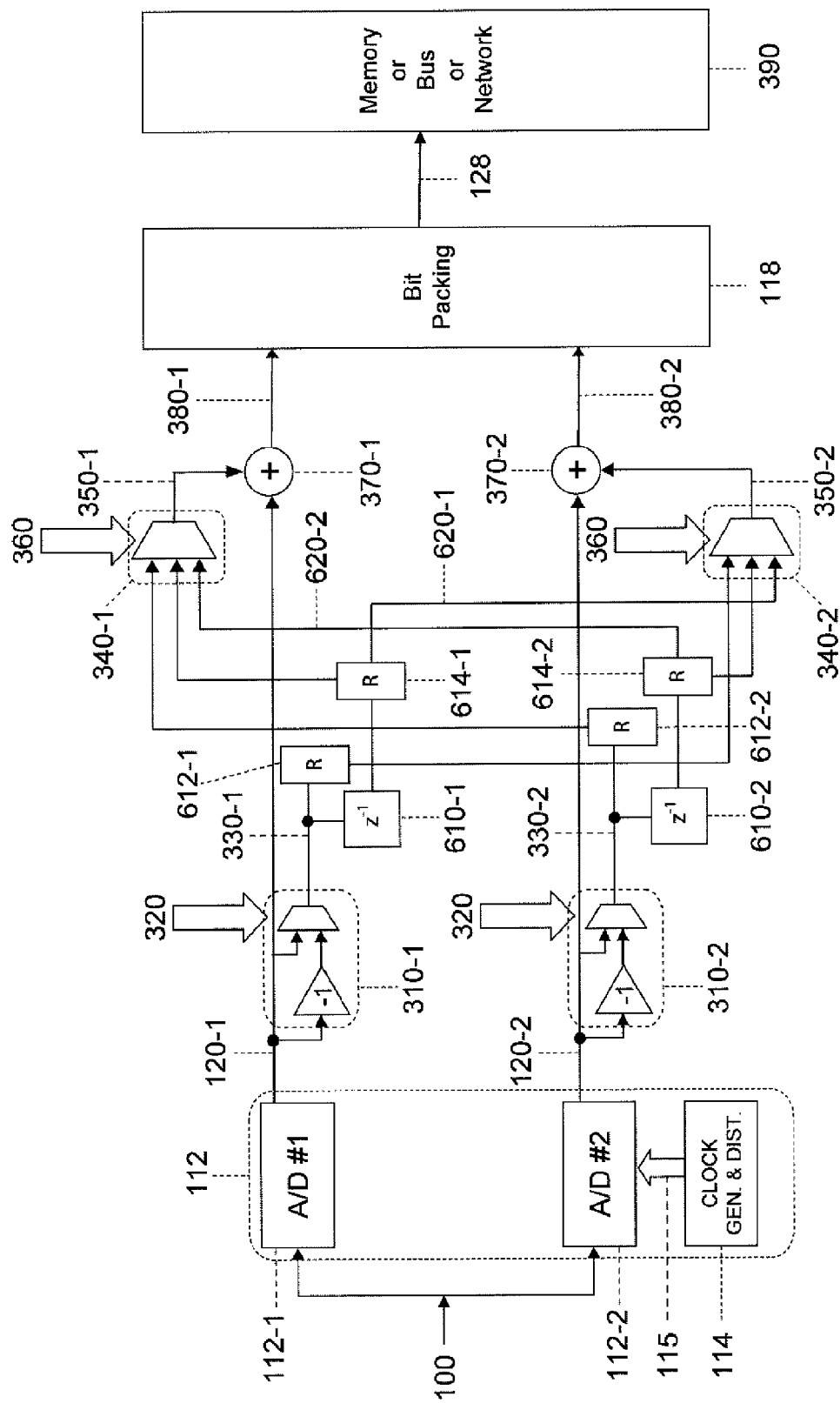
FIG. 6 is a block diagram of a data conversion and compression system for a signal with an arbitrary center frequency wherein the TIADC includes two ADCs in accordance with a preferred embodiment.

FIG. 6 is a block diagram of an alternative embodiment wherein TIADC 112 includes two ADCs 112-1 and 112-2. In this embodiment, the ADCs 112-1 and 112-2 provide a delay of one sampling interval $T_s$ relative to each other. Delay elements 610-1 and 610-2 provide delays corresponding to two and three sampling intervals $T_s$. Delay element 610-1 provides a delay of two sampling intervals relative to a current signal sample 120-1 and a delay of three sampling intervals relative to a current signal sample 120-2. Analogously, delay element 610-2 provides a delay of two sampling intervals relative to a current signal sample 120-2 and a delay of three sampling intervals relative to a current signal sample 120-1. Signal samples 120-1 and 120-2 are input to programmable inverters 310-1 and 310-2 which produce inverter output samples 330-1 and 330-2, respectively, in accordance with inverter control parameter 320. Delay elements 610-1 and 610-2 delay inverter output samples 330-1 and 330-2 by $T=1/f_{sADC}$, where $f_{sADC}$ is the sample rate of each ADC 112-1 and 112-2. Since the ADCs 112-1 and 112-2 are time-interleaved, the delay $T=2 T_s$, which corresponds to two sampling intervals. Registers 612-1 and 612-2 store inverter output samples 330-1 and 330-2 and registers 614-1 and 614-2 store delayed samples 620-1 and 620-2 for distribution to each of two multiplexors 340-1 and 340-2. Note that the delayed sample 620-1 is separated by two sampling intervals relative to a current signal sample 120-1 and by three sampling intervals relative to a current signal sample 120-2. Likewise, delayed sample 620-2 is separated by two sampling intervals relative to a current signal sample 120-2 and by three sampling intervals relative to a current signal sample 120-1. The multiplexors 340-1 and 340-2 select the appropriate multiplexor output samples 350-1 and 350-2, respectively, in accordance with multiplexor control parameter 360 as described with reference to FIG. 4. Adders 370-1 and 370-2 add multiplexor output samples 350-1 and 350-2 to signal samples 120-1 and 120-2 to form modified samples 380-1 and 380-2. Encoder 118 compresses modified samples 380-1 and 380-2 to produce compressed samples 128, as previously described with reference to FIG. 3.

Delay elements 610-1 and 610-2 are included in the embodiment illustrated in FIG. 6 so that operations can be performed on samples separated by more than the one sampling interval spanned by ADCs 112-1 and 112-2. Delay elements could also be added to the embodiment illustrated in FIG. 3 or any embodiment where the operations are performed on samples separated by a larger number of sampling intervals than spanned by the TIADC 112.

In the embodiments described above, encoder 118 has included lossless compression techniques. In alternative embodiments, lossy compression techniques can be implemented in encoder 118 either in place of or in addition to lossless compression.

It is well known in the art that lossy compression is useful in many signal processing applications. In general, lossy compression is defined as having a nonzero difference between the original signal samples and the corresponding decompressed samples. Lossy compression provides flexibility by allowing a user to select a bit rate or a signal quality that is acceptable for a particular application. This flexibility has made lossy compression the design choice for many audio, speech and video compression applications. For example, the MP3 audio compression algorithm allows users to specify a desired compressed bit rate from 64 kbps to 384 kbps. A lower compressed bit rate usually corresponds to lower audio quality of the decompressed audio waveform, although in some cases the difference in quality between two bit rates is imperceptible to most listeners. Users select the lower bit rates in order to store more music in a storage medium, such as a flash memory integrated circuit or a disk drive. However, the audio samples generated by the MP3 decompressor are not identical to the original audio samples that were provided to the MP3 compressor. In many instances, the decompressed audio samples sound the same as the original audio, but a sample-by-sample difference of the original audio samples and the decompressed samples will be nonzero.

Figure 7:
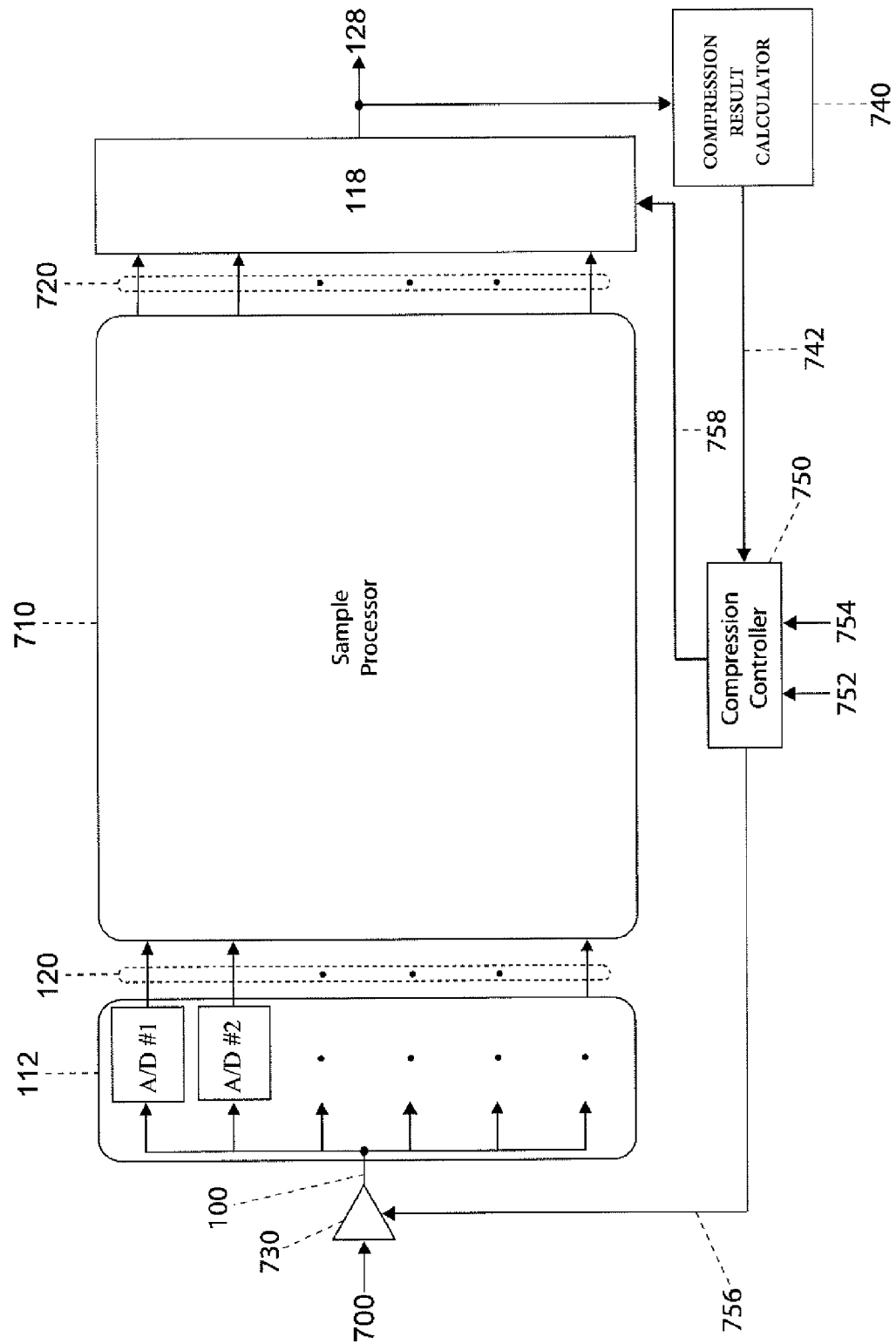
FIG. 7 is a block diagram of a data conversion and compression system for a signal with an arbitrary center frequency and including lossy compression and control in accordance with a preferred embodiment.

FIG. 7 is a block diagram of an alternative embodiment that adds lossy compression and compression control to the previously described embodiments. The programmable attenuator 730 processes an attenuator input signal 700 to produce the analog signal 100 input to the TIADC 112. An attenuator control signal 756 controls the amount of attenuation, if any, applied to attenuator input signal 700. As described for the previous embodiments, TIADC 112 samples analog signal 100 to produce a plurality of signal samples 120. Signal samples 120 are input to sample processor 710. Sample processor 710 produces a plurality of encoder input samples 720. Sample processor 710 represents the elements of the previously described embodiments that process signal samples 120 to produce input samples 720 to encoder 118. For the embodiment of FIG. 1c, the encoder input samples 720 are the third order differences 122c. For the embodiment of FIG. 1d, the encoder input samples 720 are the selected samples 138. For the embodiments of FIGS. 3 and 6, the encoder input samples 720 are the modified samples 380. Compression mode selection and control are provided by a compression result calculator 740 and a compression controller 750. Compression controller 750 supports three compression modes, including lossless compression (previously described), lossy fixed-rate compression and lossy fixed-quality compression. A compression mode selector 752 specifies the compression mode in response to user input. If the lossless compression mode is selected, the operations for forming compressed samples 128 are the same as described for the previous embodiments. If lossy compression is selected, different operations are performed depending on whether compression should preserve a fixed-quality or achieve a fixed bit rate for compressed samples 128.

For lossy fixed-quality compression, a compression parameter 754 represents a desired signal quality metric. Compression controller 750 generates an attenuator control signal 756 in accordance with compression parameter 754. In response to attenuator control signal 756, the attenuator 730 reduces the magnitude of the attenuator input signal 700 to form analog signal 100. Analog signal 100 and its corresponding signal samples 120 have smaller magnitudes after attenuation. Encoder input samples 720 will also have smaller magnitudes, reducing the number of bits required for the compressed samples 128 produced by encoder 118. The lossy fixed-quality mode allows higher compression ratios in exchange for user-controlled non-zero differences between the original input signal 700 and its corresponding decompressed signal reconstructed from compressed samples 128. During compression, either compression parameter 754 or attenuator control signal 756 are periodically stored with compressed samples 128, or alternately are sent as side information. During decompression, the magnitudes of samples in the decompressed signal are increased by an amount that is the inverse of the attenuator value in the compressor. Increasing the magnitudes of decompressed samples provides output samples that are comparable in magnitude to attenuator input signal 700.

For lossy fixed-rate compression, compression parameter 754 represents a desired bit rate or a desired compression ratio specified by the user. When lossy fixed-rate compression is specified, compression result calculator 740 computes the present compression result 742 for the compressed samples 128. Compression controller 750 compares the compression result 742 to the compression parameter 754, representing the desired compression ratio or the desired bit rate. When the present compression result 742 is less than the desired compression ratio or greater than the desired bit rate, the compression controller 750 modifies the attenuator control signal 756 so that the attenuator 730 will produce a lower magnitude analog signal 100. As for the fixed-quality case, the lower magnitude of analog signal 100 will result in fewer bits for compressed samples 128, thus improving the corresponding compression result 742 by increasing the compression ratio or decreasing the bit rate. When the measured compression result 742 equals or is greater than the desired compression ratio, no changes are made by compression controller 750. When a desired bit rate is specified, compression result calculator 740 and compression controller 750 perform analogous functions based on comparing the bit rate of compressed samples 128 to the desired bit rate. When the user selects the fixed rate compression mode, compression result calculator 740 and compression controller 750 operate continuously, comparing the actual compression ratio or bit rate and the user-specified compression ratio or bit rate.

The lossy fixed-rate compression mode allows control of the bandwidth of compressed samples 128. It is well known to those skilled in the art that a fixed data rate is preferable in many signal processing systems. Since lossless compression usually generates a stream of compressed samples 128 whose bandwidth varies over time, an interface such as a FIFO will be required to support the varying data rates. A FIFO interface is more complicated than a fixed-rate interface, since it requires additional control signals (half full, almost full, almost empty, etc.). In contrast, a lossy fixed-rate compression mode can achieve a fixed data rate, corresponding to a fixed compression ratio for the compressed samples 128. The compressed samples 128 can be transferred across a bus or network or to a storage medium at a fixed data rate. The fixed data rate simplifies the interface for transfer of the compressed samples 128.

Referring again to FIG. 7, in an alternative embodiment for lossy compression, a bank of shift registers (not shown in FIG. 7) can be included after the TIADC 112 to reduce the magnitudes of the signal samples 120 before they are input to the sample processor 710. The bank of shift registers can be included with or without attenuator 730. The compression controller 750 can direct the bank of shift registers to remove a number of LSBs from the signal samples 120 in response to a control signal from the compression controller 750. Removing a LSB is mathematically equivalent to reducing the magnitude of a signal sample 120i by a factor of two. Assuming the effects of quantization by the TIADC 112 are sufficiently small, removing a LSB from each of the signal samples 120 mathematically approximates reducing the gain of the attenuator 730 by one half. Provided that reducing gain by multiples of two is appropriate for the application, the compression controller 750 can direct a bank of shift registers to remove LSBs from signal samples 120. If reducing gain by powers of two does not provide sufficient granularity, multipliers can also be applied to attenuate signal samples 120 before they are input to the shift registers. Multiplication of a signal samples 120 by an appropriate factor prior to removing an appropriate number LSBs will scale the signal samples 120 by arbitrary amounts, not restricted to powers of two. Alternatively, multipliers alone can be applied to signal samples for attenuation instead of shift registers. Compression controller 750 can calculate the appropriate factor for the multipliers and number of LSBs removed by the shift registers to achieve the desired amount of compression or the desired signal quality represented in compressed samples 128.

In another embodiment for lossy compression, a bank of shift registers can be applied to the encoder input samples 720. Since the sample processor 710 performs linear operations on the signal samples 120, and provided that quantization effects of TIADC 112 are sufficiently small, removing a LSB from each of the encoder input samples 720 mathematically approximates reducing the gain of the attenuator 730 by one half. As described in the previous paragraph, multipliers can be applied to encoder input samples 720 before they are input to the shift registers to provide scaling by arbitrary amounts, not restricted to powers of two. Again, the compression controller 750 can calculate the appropriate factor for the multipliers and number of LSBs removed by the shift registers to achieve the desired amount of compression in compressed samples 128.

Lossy compression can also be achieved by implementing one or more lossy waveform encoding algorithms in encoder 118. Lossy waveform encoding algorithms can be incorporated in encoder 118 for the embodiments previously described, either in addition to or instead of the lossy encoding algorithms. Several lossy waveform encoders exist in the present art whose bit rates can be controlled and whose complexity is suitable for high speed implementations. Lossy waveform encoders, such as adaptive differential pulse code modulation (ADPCM) and linear predictive coding (LPC), are currently used for low bit rate speech and audio encoding, where the sample rates are typically 8 Ksamp/sec for speech and 44.1 Ksamp/sec for audio. Algorithms such as ADPCM and LPC can be implemented in encoder 118 to provide compression of encoder input samples 720 with a controlled amount of loss.

In alternative embodiments for lossy compression, encoder 118 includes one or more lossy waveform encoding algorithms having two or more output bit rates for compressed samples 128, such as ADPCM or LPC. For example, the bit rate of Dallas Semiconductor's DS2165Q multi-standard ADPCM encoder can achieve lossy compression ratios of 2:1, 2.67:1 and 4:1. When used in an implementation of encoder 118, these compression ratios would be the ratios of the number of bits in the encoder input samples 720 to the number of bits in the compressed samples 128. Returning to FIG. 7, compression controller 750 provides an encoder control signal 758 to encoder 118 for selection and control of lossy encoding. Compression controller 750 can select an appropriate compression ratio of the multi-rate ADPCM encoder that, when combined with the sample range reduction provided by sample processor 710, achieves the desired compression indicated by compression parameter 754. Similarly, lossy LPC speech encoders, such as those described in the International Telecommunication Union (ITU) Recommendation G.723.1 entitled "Dual Rate Speech Coder for Multimedia Communications Transmitting at 5.3 and 6.3 kbit/s," offer two compressed bit rates, allowing a tradeoff between bit rate and quality. When implemented in encoder 118, this LPC encoder offers selectable output bit rates for compressed samples 128. Compression controller 750 can select the appropriate LPC compression ratio that, when combined with the sample range reduction provided by sample processor 710, achieves a user's desired compression ratio or bit rate for compressed samples 128.

Figure 8:
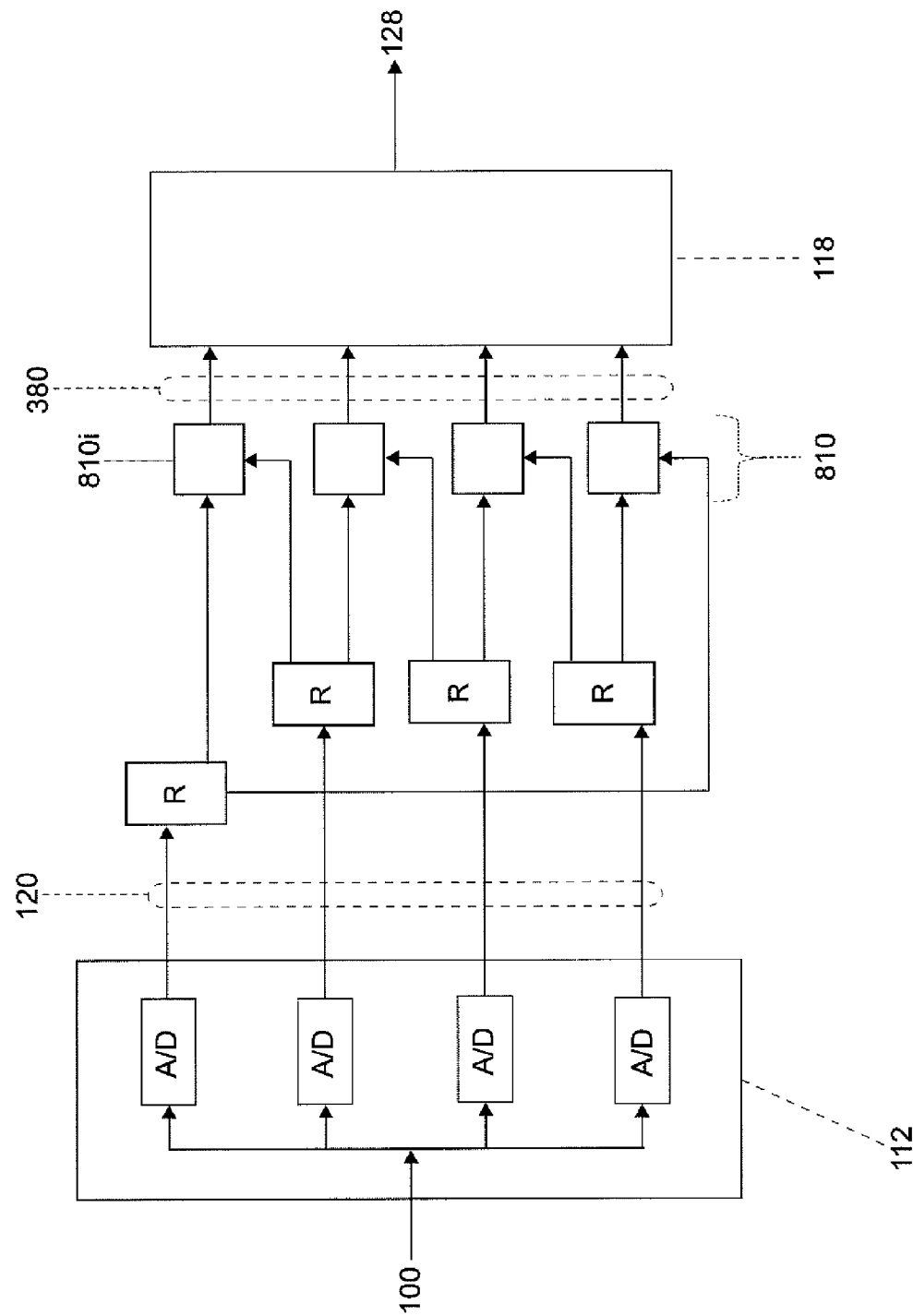
FIG. 8 is a block diagram of a data conversion and compression system for a signal with a fixed arbitrary center frequency in accordance with a preferred embodiment.

In applications where the center frequency of the input signal is a fixed value, only one of the alternative operations for multiplexer control shown in FIG. 5 is implemented. An embodiment for compression of a signal with a fixed center frequency of either $f_s/6$ or $f_s/3$ is given in FIG. 8. Signal samples 120 are distributed so that samples separated by three sampling intervals, corresponding to x(i) and x(i−3), are input to a plurality of arithmetic operators 810. For a center frequency of $f_s/6$, each arithmetic operator 810i is an adder and each modified sample 380i corresponds to a sum x(i)+x(i−3). For a center frequency of $f_s/3$, the arithmetic operator 810i performs subtraction and each modified samples 380i corresponds to a difference x(i)−x(i−3). In embodiments for other center frequencies, signal samples 120 would be distributed so that inputs to the arithmetic operators 810 would be separated by one or two sampling intervals and the arithmetic operators 810 would perform the appropriate operation in accordance with FIG. 5.

Decompression of compressed samples 128 inverts the operations performed for compression. A complementary decoding process unpacks the encoded tokens of compressed samples 128 by reversing the packing operations of encoder 118 to reconstruct the encoder input samples 720. Inverse operations to those of the sample processor 710 are applied to the reconstructed encoder input samples to reconstruct the signal samples 120. For the baseband signal compression shown in FIG. 1c, the reconstructed encoder input samples are reconstructed third order differences. The corresponding decompression includes first, second and third integral generators to invert the first, second and third order differences 116a, 116b and 116c, respectively, to form reconstructed signal samples. For baseband signal compression that included only first order difference samples 122a, the corresponding decompressor decodes the compressed samples 128 to reconstruct the first order difference samples and integrates the reconstructed first order difference samples to produce reconstructed signal samples. For a compressed signal with an arbitrary center frequency, the corresponding decompressor decodes the compressed samples 128 to form reconstructed modified samples. The decompressor then performs the arithmetically inverse operations on the reconstructed modified samples to produce reconstructed signal samples. The decompressor regenerates an exact copies of signal samples 120 for lossless compression or an approximations of signal samples 120 for lossy compression. In U.S. Pat. No. 7,009,533, incorporated herein by reference, the present inventor describes compression of samples output from a single ADC and decompression operating in concert with reference to FIGS. 43 and 44 therein.

The present invention can be implemented using a variety of technologies. A preferred implementation integrates an embodiment of the present invention into an existing TIADC device, such as that described by Poulton et al. in "A 20 GS/s 8b ADC with a 1 MB Memory in 0.81 u CMOS", ISSCC 2003, Session 18, incorporated herein by reference. This paper describes the use of 80 parallel ADCs, each sampling at 250 Msamp/sec. In this chip, the compression technique of the present invention could be implemented using a register-transfer-level (RTL) language such as VHDL or Verilog. The RTL could then be synthesized into a gate-level representation of the algorithm that operates in real time, i.e. fast enough to compress the outputs of 80×250 MHz ADCs.

Another implementation can use field programmable gate arrays (FPGA) devices, such as those manufactured by Xilinx and Altera. The VHDL or Verilog description of an embodiment of the present invention would be synthesized to the target FPGA. Because the clock rates of FPGAs are normally slower than the clock rates of ASICs, the sustained compression rate for a FPGA implementation would normally be lower than that of an ASIC implementation.

In another implementation, the present invention can be integrated into a separate, stand-alone ASIC that can be coupled to the output of a TIADC chip. In this implementation, the stand-alone ASIC is an all-digital device capable of compressing the N output channels of the TIADC converter chip. The stand-alone ASIC implementation can be fabricated using CMOS or other semiconductor process technology.

Figure 9:
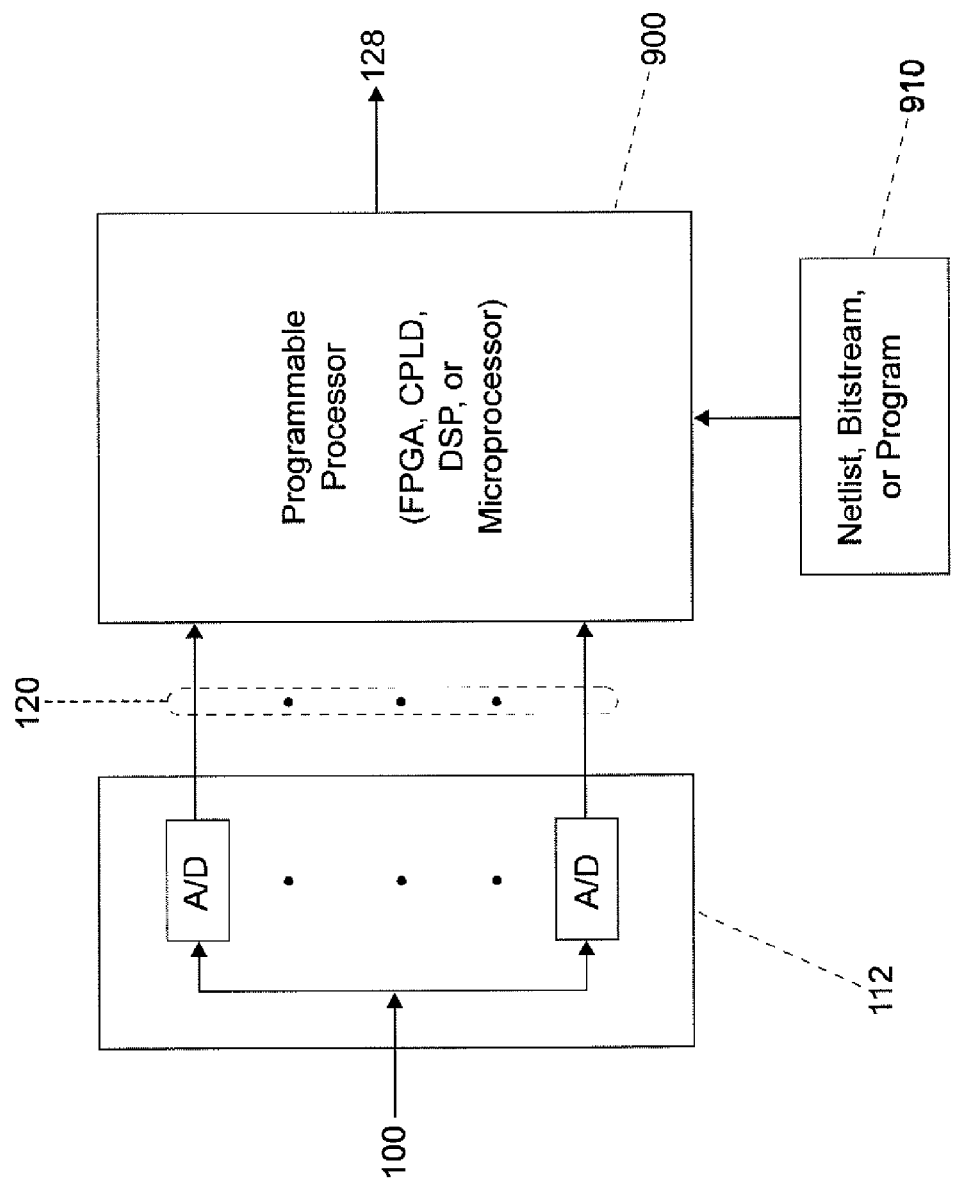
FIG. 9 is a block diagram of an implementation of a data conversion and compression system control in accordance with a preferred embodiment.

An embodiment of the present invention using a programmable device to compress the output of a TIADC is given in FIG. 9. TIADC 112 samples analog signal 100 to produce the plurality of signal samples 120. The programmable processor 900 applies the compression operations of the present invention to produce compressed samples 128. The programmable processor 900 comprises a digital signal processor (DSP), microprocessor, complex programmable logic device (CPLD), FPGA or other programmable device. A program 910 implements the compression operations of the present invention in programmable processor 900. Depending on the type of programmable processor 900, program 910 can be a netlist, bitstream or other type of processor executable instructions and data.

In DSP or microprocessor implementations, program 910 comprises instructions for executing operations for compression of the present invention. Microprocessors and DSPs often use external read-only memory (ROM) or random access memory (RAM) that store the program 910 represented in binary instructions (object code) and data. In other architectures, a DSP or microprocessor may be loaded with program 910 using a serial or parallel port. Some DSPs and microprocessors include on-chip ROM, flash or other non-volatile storage that is actually part of the DSP chip or microprocessor. For these architectures, program 910 can be stored on-chip. The device would be able to self-boot and begin executing the instructions for compression in program 910. Examples of DSPs that can be used to implement the present invention include Texas Instruments' TMS320 family of DSP chips, such as TMS320C2xx, TMS320C3xx, TMS320C5xx and TMS320C6xx. These are often used to implement DSP algorithms at moderate sample rates (generally below 10 Msamp/sec per ADC, with exceptions for simple algorithms that do not require many instructions per sample). Also, any microprocessor such as the Motorola/Freescale 68000 based family, the ARM7, ARM9 and ARM11 family of microprocessors, and the 8051 family of microprocessors can be programmed to implement the present invention. For any implementation based on a DSP or microprocessor, the instructions and related data for the present invention implemented in program 910 can be stored in an external or internal ROM or RAM, flash or other storage device. Program 910 would be loaded into the DSP or microprocessor for execution.

For applications requiring higher sample rates, a programmable hardware device such as a CPLD or FPGA can implement programmable processor 900. Program 910 implements the compression operation of the present invention as a netlist or bitstream and can be stored in either an external or internal ROM, RAM, flash or other storage device. Because implementations based on CPLDs or FPGAs can support higher sample rates, they are preferred over DSP chips or microprocessors. In general, CPLD devices include some form of on-chip storage, so no external ROM, RAM or flash is required to load the netlist or bitstream into a CPLD. The CPLD is ready to operate as soon as power is applied to it and samples are available from TIADC 112. In contrast, the most popular FPGAs by Altera and Xilinx are RAM-based, so that their netlist or bitstream must be loaded into the FPGA from an external ROM, RAM or flash memory device prior to receiving samples from TIADC 112. Well-known vendors of CPLDs and FPGAs include Altera, Xilinx, Actel and Lattice. Altera offers the RAM-based Cyclone (I and II) and Stratix (I and II) families of FPGAs and the MAX and MAX-II families of CPLDs. Xilinx offers the RAM-based Spartan (I, II and III) and Virtex (2, 4 and 5) families of FPGAs and the CoolRunner family of CPLDs. Actel offers the flash-based ProASIC (1, 2 and 3) family of FPGAs and the Axcelerator family of one-time programmable FPGAs. Other FPGAs and CPLDs could be used to implement the present invention at high sample rates, usually above 10 Msamp/sec per ADC.

The present invention can also be implemented as a compression subsystem in a system that includes a TIADC device, such as a digital storage oscilloscope. The compression subsystem can be designed using Verilog, VHDL or other RTL design language. Incorporating the present invention in a system with a TIADC device may increase the gate count and power consumption of the system. However, the benefits of compression will decrease other system costs, such as the cost of storage to capture the compressed TIADC samples or the cost of a bus or network to transfer the compressed samples to other devices within the system for subsequent measurement, processing or display.

The present invention can improve the performances of the following devices, all of which use TIADCs to sample analog waveforms:

a) TIADC integrated circuits, such as the National Semiconductor ADC081500, ADC08D1500, Maxim MAX108 and Atmel AT84AD001B;

b) Multi-chip modules, such as the Analog Devices AD122401, AD12500, AD12501 and various modules produced by Maxtek Corporation (owned by Tektronix);

c) Evaluation boards for the National Semiconductor and Atmel TIADC devices listed above;

d) Digital storage oscilloscopes, such as the Agilent Infiniium product line, Tektronix TDS6000 and TDS7000 product lines and LeCroy WaveRunner product line.

While the preferred embodiments of the invention have been illustrated and described, it will be clear that the invention is not limited to these embodiments only. Numerous modifications, changes, variations, substitutions and equivalents will be apparent to those skilled in the art, without departing from the spirit and scope of the invention, as described in the claims.

What is claimed is:

1. A method, comprising:

converting an analog signal to a sequence of sets of signal samples using a plurality of parallel, time-interleaved analog to digital converters that are configured to form sets of samples of the analog signal during respective clock intervals and to output corresponding sets of signal samples at a clock rate that is the inverse of the clock interval, wherein a nth signal sample is output from a nth analog to digital converter, where a plurality of signal samples in each set represents consecutive samples separated in time by a sampling interval that is less than the clock interval;

adding or subtracting a plurality of corresponding offset signal samples to or from the plurality of signal samples in a particular set in the sequence of sets to form a plurality of modified samples, wherein each corresponding offset signal sample is separated in time from a corresponding one of the plurality of signal samples in the particular set by a predetermined number of sampling intervals;

encoding the plurality of modified samples to form a plurality of compressed samples at a bit rate in response to one or more control parameters;

measuring a compression result parameter of the compressed samples;

comparing the compression result parameter to a desired compression parameter to form a comparison parameter; and adjusting at least one of the control parameters in accordance with the comparison parameter to modify a bit rate of the compressed samples.

2. The method of claim 1, wherein the control parameters include a compression control parameter, wherein the step of encoding is performed in accordance with the compression control parameter.

3. The method of claim 1, wherein the compression result parameter and the desired compression parameter are based on the bit rate of the compressed samples or a compression ratio of the compressed samples to provide fixed-rate compression.

4. The method of claim 1, wherein the compression result parameter and the desired compression parameter are based on a signal quality metric to provide fixed-quality compression.

5. The method of claim 1, wherein the control parameters include an attenuation control parameter, the method further comprising at least one of the following steps:
attenuating the analog signal input to the N parallel, time-interleaved analog to digital converters in accordance with the attenuation control parameter; and
reducing magnitudes of the signal samples output from the N parallel, time-interleaved analog to digital converters in accordance with the attenuation control parameter.

6. A system for compressing a plurality of signal samples output from a plurality of parallel, time-interleaved analog to digital converters that are configured to form sets of samples of an analog signal during respective clock intervals and to output corresponding sets of signal samples at a clock rate that is the inverse of the clock interval, wherein a nth signal sample is output from a nth analog to digital converter, where the plurality of signal samples in each set represents consecutive samples separated in time by a sampling interval that is less than the clock interval, comprising:
a plurality of arithmetic operators, each arithmetic operator coupled to receive a corresponding signal sample as a first input and a corresponding offset signal sample as a second input, wherein the corresponding signal sample and the corresponding offset signal sample are separated in time by a predetermined number of sampling intervals, wherein each arithmetic operator calculates a modified sample by adding or subtracting the second input to or from the first input, the plurality of arithmetic operators producing a plurality of modified samples;
an encoder coupled to receive the plurality of modified samples and producing a plurality of compressed samples; and
a controller providing one or more control parameters to modify a bit rate of the compressed samples, wherein the controller determines the control parameter by comparing a compression result parameter of the compressed samples to a desired compression parameter.

7. The system of claim 6, wherein the compression result parameter and the desired compression parameter are based on the bit rate of the compressed samples or a compression ratio of the compressed samples to provide fixed-rate compression.

8. The system of claim 6, wherein the compression result parameter and the desired compression parameter are based on a signal quality metric to provide fixed-quality compression.

9. The system of claim 6, wherein the control parameters include a compression control parameter provided to the encoder, wherein the encoder responds to the compression control parameter to modify the bit rate of the compressed samples.

10. The system of claim 6, wherein the control parameters include an attenuation control parameter, the system further comprising at least one of the following:
an analog attenuator coupled to receive an attenuator input analog signal and producing the analog signal input to the plurality of parallel, time-interleaved analog to digital converters, wherein the analog attenuator responds to the attenuation control parameter to modify the bit rate of the compressed samples; and
a digital attenuator coupled to receive the plurality of signal samples output from the plurality of parallel, time-interleaved analog to digital converters to produce a plurality of attenuated signal samples input to the plurality of arithmetic operators, wherein the digital attenuator responds to the attenuation control parameter to modify the bit rate of the compressed samples.

11. A method, comprising:
converting an analog signal to a sequence of sets of signal samples using a plurality of parallel, time-interleaved analog to digital converters that are configured to form sets of samples of the analog signal during respective clock intervals and to output corresponding sets of signal samples at a clock rate that is the inverse of the clock interval, where the plurality of signal samples in each set represents consecutive samples separated in time by a sampling interval that is less than the clock interval;
computing a plurality of differences from a plurality of pairs of the consecutive signal samples to form a plurality of difference samples, wherein each difference is formed between the consecutive signal samples of each pair;
encoding the plurality of difference samples to form a plurality of compressed samples at a bit rate in response to one or more control parameters;
measuring a compression result parameter of the compressed samples;
comparing the compression result parameter to a desired compression parameter to form a comparison parameter; and
adjusting at least one of the control parameters in accordance with the comparison parameter to modify the bit rate of the plurality of compressed samples.

12. The method of claim 11, wherein the control parameters include a compression control parameter, wherein the step of encoding is performed in accordance with the compression control parameter.

13. The method of claim 11, wherein the compression result parameter and the desired compression parameter are based on the bit rate of the compressed samples or a compression ratio of the compressed samples to provide fixed-rate compression.

14. The method of claim 11, wherein the compression result parameter and the desired compression parameter are based on a signal quality metric to provide fixed-quality compression.

15. The method of claim 11, wherein the control parameters include an attenuation control parameter, the method further comprising at least one of the following steps:
attenuating the analog signal input to the N parallel, time-interleaved analog to digital converters in accordance with the attenuation control parameter; and
reducing magnitudes of the signal samples output from the N parallel, time-interleaved analog to digital converters in accordance with the attenuation control parameter.

16. A system for compressing a plurality of signal samples output from a plurality of parallel, time-interleaved analog to digital converters that are configured to form sets of samples of an analog signal during respective clock intervals and to output corresponding sets of signal samples at a clock rate that is the inverse of the clock interval, where the plurality of signal samples in each set represents consecutive samples separated in time by a sampling interval that is less than the clock interval, comprising:
a difference processor coupled to receive the plurality of signal samples output from the plurality of parallel, time-interleaved analog to digital converters, the difference processor comprising a plurality of difference operators, each difference operator receiving a corresponding pair of consecutive signal samples and producing a corresponding one of a plurality of difference samples;

an encoder coupled to receive the plurality of difference samples and producing a plurality of compressed samples; and a controller providing one or more control parameters to modify a bit rate of the compressed samples, wherein the controller determines the control parameter by comparing a compression result parameter of the compressed samples to a desired compression parameter.

17. The system of claim 16, wherein the compression result parameter and the desired compression parameter are based on the bit rate of the compressed samples or a compression ratio of the compressed samples to provide fixed-rate compression.

18. The system of claim 16, wherein the compression result parameter and the desired compression parameter are based on a signal quality metric to provide fixed-quality compression.

19. The system of claim 16, wherein the control parameters include a compression control parameter provided to the encoder, wherein the encoder responds to the compression control parameter to modify the bit rate of the compressed samples.

20. The system of claim 16, wherein the control parameters include an attenuation control parameter, the system further comprising at least one of the following:

an analog attenuator coupled to receive an attenuator input analog signal and producing the analog signal input to the plurality of parallel, time-interleaved analog to digital converters, wherein the analog attenuator responds to the attenuation control parameter to modify the bit rate of the compressed samples; and a digital attenuator coupled to receive the plurality of signal samples output from the plurality of parallel, time-interleaved analog to digital converters to produce a plurality of attenuated signal samples input to the plurality of arithmetic operators, wherein the digital attenuator responds to the attenuation control parameter to modify the bit rate of the compressed samples.

21. A system for compressing a plurality of signal samples output from a plurality of parallel, time-interleaved analog to digital converters that are configured to form sets of samples of an analog signal during respective clock intervals and to output corresponding sets of signal samples at a clock rate that is the inverse of the clock interval, where the plurality of signal samples in each set represents consecutive samples separated in time by a sampling interval that is less than the clock interval, comprising:

differencing means for calculating a plurality of difference samples between a plurality of pairs of consecutive signal samples within each set; and encoding means for encoding the plurality of difference samples to form a plurality of compressed samples corresponding to each set.

22. The system of claim 21, wherein the differencing means further comprises:

higher-order differencing means for calculating a plurality of higher-order differences of the consecutive signal samples within each set to form the plurality of difference samples provided to the encoding means.

* * * * *